(12) United States Patent
Craft, Jr. et al.

(10) Patent No.: US 7,100,385 B2
(45) Date of Patent: Sep. 5, 2006

(54) THERMAL MANAGEMENT SYSTEM FOR ELECTRICAL ENCLOSURES

(75) Inventors: Thomas Francis Craft, Jr., Hackettstown, NJ (US); Ricardo Ortiz, Cuautitlan Izcalli (MX)

(73) Assignee: Lucent Technologies Inc., Murray Hill, NJ (US)

(*) Notice: Subject to any disclaimer, the term of this patent is extended or adjusted under 35 U.S.C. 154(b) by 184 days.

(21) Appl. No.: 10/910,701

(22) Filed: Aug. 3, 2004

(65) Prior Publication Data

US 2006/0026978 A1 Feb. 9, 2006

(51) Int. Cl.
  F25B 49/00 (2006.01)
  F25D 17/00 (2006.01)
  F25D 19/00 (2006.01)
  F24D 3/16 (2006.01)

(52) U.S. Cl. .................. 62/176.6; 62/178; 62/455; 236/44 C; 236/49.3; 165/56

(58) Field of Classification Search ............ 62/176.6, 62/177, 178, 180, 451, 454, 455; 236/44 C, 236/49.3; 165/53, 56
See application file for complete search history.

(56) References Cited

U.S. PATENT DOCUMENTS

| 4,290,247 A | * | 9/1981 | Alderman .................. 52/302.3 |
| 5,353,564 A | * | 10/1994 | Hansen ..................... 52/407.1 |
| 5,988,264 A | * | 11/1999 | Goldsmith ................. 165/48.1 |
| 2002/0184906 A1 | * | 12/2002 | Faries, Jr. .................... 62/229 |

* cited by examiner

Primary Examiner—Marc Norman
(74) Attorney, Agent, or Firm—M. I. Finston

(57) ABSTRACT

To improve the thermal management of an enclosure for electrical equipment or the like, one or more wall-mounted panels are provided. An air-filled space between each panel and the adjacent wall, door, or ceiling has insulative behavior when the air in the space is stagnant. Accordingly, thermal exchange through the wall, etc. is impeded. When the air in the air-filled space is circulated, thermal exchange is permitted.

11 Claims, 3 Drawing Sheets

THERMAL MANAGEMENT SYSTEM FOR ELECTRICAL ENCLOSURES

FIELD OF THE INVENTION

This invention relates to the thermal design of enclosures for heat-generating equipment such as communications devices or other electrically powered equipment.

ART BACKGROUND

Outside plant enclosures for electrically powered equipment such as communications equipment need to be maintained within specified temperature ranges to prevent equipment failure from, e.g., overheating. Such enclosures are often air conditioned to prevent overheating. The enclosures are often insulated from the external environment, particularly in hot climates or in hot seasons, to reduce overall demand on the air conditioning system and to reduce the cycling of the air conditioning system between ON and OFF states. Temperature cycling is undesirable because it can accelerate the failure of electronic components.

Insulation of such enclosures has some disadvantages, however. For example, in the event that the air conditioning system is shut down or there is an outage of utility-provided power, the interior of the enclosure may rise to temperatures much greater than the external temperature. As a consequence, equipment is more likely to overheat and fail.

Thus, there is a need for a new thermal management system which can suppress cycling of the interior temperature of the enclosure and also suppress overheating when the air conditioning system is not operating.

SUMMARY OF THE INVENTION

We have invented such a thermal management system. In an exemplary embodiment of our invention, a panel is mounted substantially parallel to a wall, ceiling, or door of the enclosure. Such a panel will be generally referred to herein, for convenience and without limitation, as a "wall-mounted panel." The panel is mounted at a standoff distance from the adjacent wall, ceiling, or door, so as to leave an air-filled space between the panel and the wall, ceiling, or door. When undisturbed, the air-filled space behaves like an insulator and reduces thermal contact between the interior of the enclosure and the external environment. One or more controllable fans or other motive devices are provided for circulating interior air through the air-filled space. When the air in the air-filled space is circulated, thermal contact increases between the interior of the enclosure and the external environment.

In specific embodiments of the invention, a temperature-sensitive controller is provided for the fans or other motive devices. The controller is adapted to cause air circulation when the interior temperature exceeds the external temperature and falls within specified ranges.

Accordingly, the invention in a broad aspect involves an enclosure. At least one panel is mounted substantially parallel to a bounding surface of the enclosure such as a wall, door, or ceiling, and separated from the bounding surface by a fluid-filled gap. One or more fans or other motive devices are provided for controllably moving the fluid through the gap. A controller is provided. The controller is adapted to activate the motive device or devices under specified interior and external temperature conditions, thereby to enhance heating or cooling of the enclosure by thermal exchange through the bounding surface.

DETAILED DESCRIPTION

Figure 1:
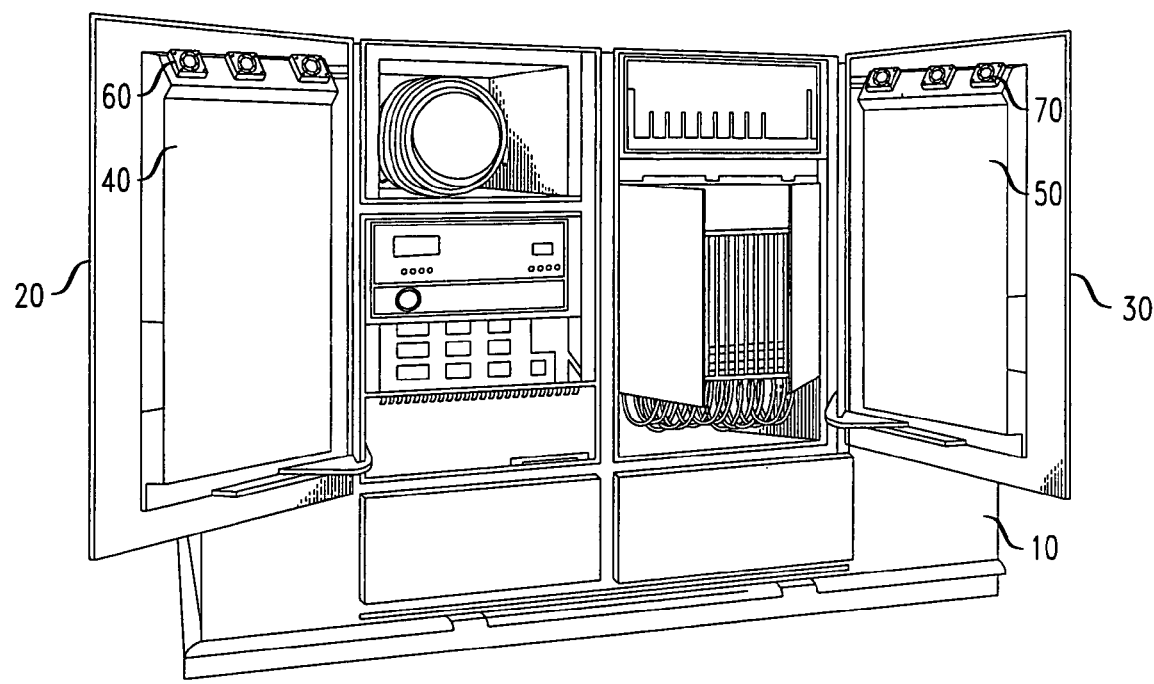
FIG. 1 shows an electronics cabinet of a kind that is common in the telecommunications industry. On the inner side of each door is a wall-mounted panel according to the invention in an exemplary embodiment.

FIG. 1 shows an electronics cabinet 10 of a kind that is common in the telecommunications industry. The cabinet has doors 20 and 30. Mounted on the inner faces of the doors are wall-mounted panels 40 and 50, respectively. The cabinet is made from a thermally conductive, metallic material such as aluminum.

Each panel is mounted substantially parallel to its corresponding door. In this regard, "substantially parallel" means that the air layer between the panel and the door is sufficiently confined that when static, it measurably insulates the door from the interior of the cabinet, but when set into motion, the resulting airflow is not interrupted by any constriction between an edge of the panel and the face of the door.

Each panel stands off from the inner face of its corresponding door by a standoff distance. The standoff distance is selected to provide a desired degree of insulation, without projecting an excessive distance into the interior of the cabinet. A typical range of standoff distances will be 10–30 mm. If the standoff distance is too small, insulative behavior will be inadequate due to conduction and radiation across the air layer. If the standoff distance is too great, insulative behavior will be inadequate due to natural, i.e., unforced, convection within the air layer.

Figure 2:
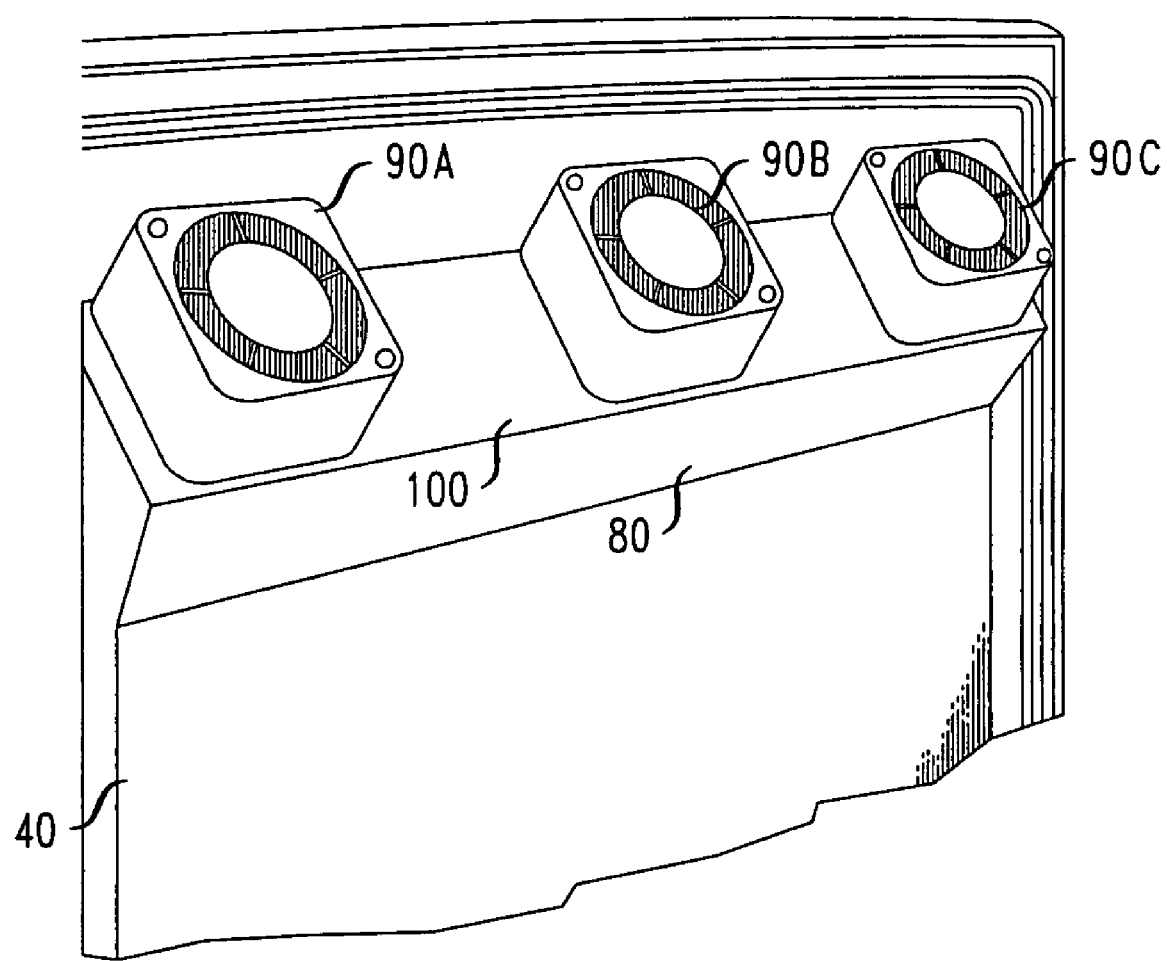
FIG. 2 is a detail of FIG. 1, showing a bank of fans mounted along a top edge of a wall-mounted panel.

Forced convection of interior air is used to switch the air layer from an insulative to a non-insulative state. Forced convection is provided by banks 60, 70 of fans, shown in FIG. 1 as three in number. As illustrated in FIG. 2, panel 40, for example, includes a projecting bulkhead 80 along the top of the panel. Fans 90A, 90B, and 90C are mounted on the bulkhead. Mounting surface 100 of the bulkhead is angled so as to efficiently direct the airflow from the fans downward (as seen in the figure) into the airspace.

The number of fans should be selected based on the desired amount of forced convection, the volume of the airspace, the length of the edge along which the fans are mounted, and the individual capacities of the fans used.

Although the wall-mounted panels illustrated in FIGS. 1 and 2 are mounted on the cabinet doors, it should be noted that similar panels can also be mounted on the walls of the cabinet and even on the ceiling.

Because insulation is provided primarily by the air layer and not by the panel itself, the choice of material for the panel is not critical. In practice, we have used aluminum panels. However, other panel materials are also readily used, such as steel, polymeric materials such as polycarbonate or acrylate, or composite materials.

In practice, we have found it useful to close the vertical (as seen in FIG. 1) sides of the airspace to provide for ducting of the forced air. We have found that this practice tends to promote counterflow heat exchange in the systems we have studied.

In general, fans will be the most convenient motive devices for forced convection. However, other motive devices may be employed, such as axial fans or motorized impellers.

Advantageously, the fans will be turned on and off by a control device which responds to interior and external temperature conditions. For example, an air conditioned cabinet, or other type of enclosure, may have an internal temperature setting $T_{AC}$ at which the air conditioning system will automatically be activated. Such a setting might be, e.g., 25 C. In at least some such cases, it will be advantageous to activate the fans when the interior temperature is greater than the external temperature and is also at least a specified level $T_{FAN}$ which has been set somewhat lower than $T_{AC}$, e.g. at 22 C. Conversely, it may be advantageous to deactivate the fans when the air conditioning system is activated, and when the interior or exterior temperature falls below a specified, relatively low, value.

Under a temperature program as described above, the insulative state of the air space will, at the end of an air conditioning cycle, help to keep the interior temperature below the external temperature. As the internal temperature rises, the air conditioning system will cycle back on in the normal way if the external temperature is still higher than the internal temperature.

However, a different sequence will occur if the temperature gradient reverses before $T_{AC}$ is reached, i.e., if the internal temperature comes to exceed the external temperature. In that case, the fans will come on when $T_{FAN}$ is reached. The cooling that results directly from switching the air layer to a non-insulative condition will delay the next activation of the air conditioning system.

Thus, the cycling of the air conditioning system will be reduced in frequency. In the event of a failure of the air conditioning system, the activation of the fans will prevent the interior temperature from rising substantially above the external temperature. It should be noted in this regard that because fans have relatively low power requirements, emergency power can be provided to the fans from, e.g., batteries or solar panels even when a failure of utility-provided power makes the air conditioning system unavailable.

Figure 3:
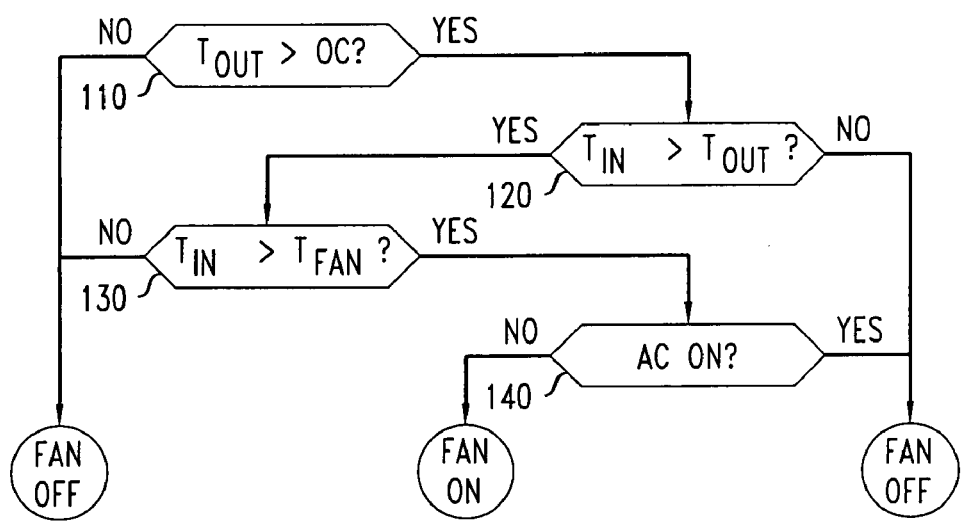
FIG. 3 is a block diagram of an illustrative program for controlling fans or other motive devices in accordance with the present invention.

For example, FIG. 3 illustrates a simple program for thermal control under which the fans are activated if and only if the outside temperature is above freezing (condition 110), the interior is warmer than the exterior (condition 120), the interior temperature is above $T_{FAN}$ (condition 130), and the air conditioning is shut off, either in the course of normal operation or due to failure (condition 140).

Figure 4:
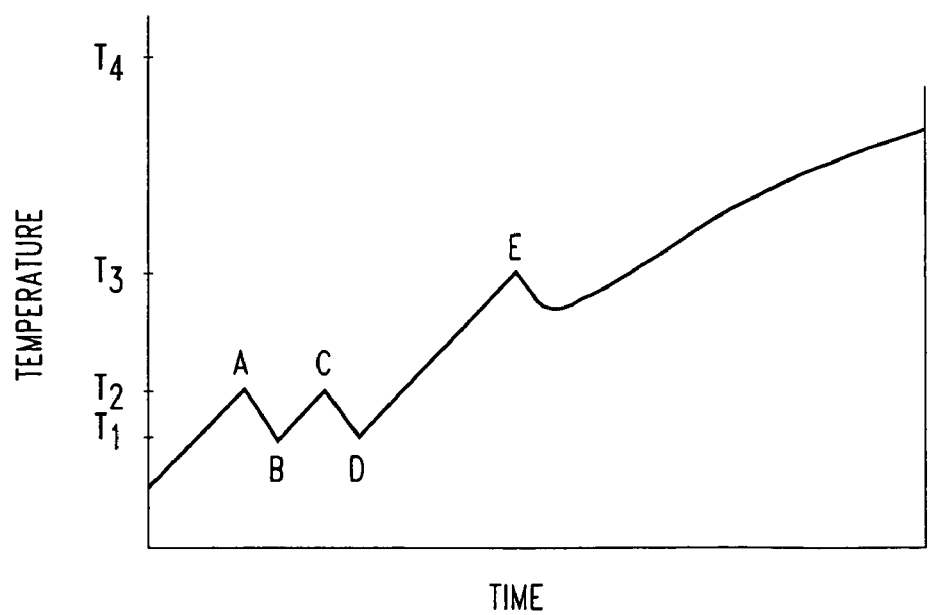
FIG. 4 is an idealized illustration of a thermal trajectory as might be measured within an outdoor electronics enclosure equipped with air conditioning as well as with thermal control according to the present invention.

FIG. 4 illustrates a typical thermal trajectory for the interior of an outdoor electronics cabinet equipped with air conditioning and with a fan-driven thermal management system as described herein. At point A, the interior temperature reaches the set point $T_2$ for switching on the air conditioner. The interior temperature drops until at point B it reaches the set point $T_1$ for switching off the air conditioner. The temperature similarly cycles up to point C and back down to point D. At point D a failure of the air conditioner occurs. Consequently, the temperature rises above $T_2$ until at point E it reaches the set point $T_3$ for switching on the fans. After a short initial drop, the temperature again begins to rise, but at a slower rate than before the fans were switched on. The temperature rise slows progressively as a limiting temperature $T_4$ is asymptotically approached.

In addition to sensing the interior and exterior temperatures, it is also possible by well-known methods to sense the amount of solar loading on each side of the enclosure. Accordingly, a control program is readily implemented which will activate heat exchange for cooling the interior only on the side or sides having the least solar loading.

In addition to temperature, the controller can also be made sensitive to other environmental conditions, such as humidity. For example, if the air conditioner has cooled the interior to below the outside temperature, but as a result the interior temperature has fallen below the dew point, the fans can be activated in order to warm the interior so as to inhibit condensation.

Although the illustrative embodiment described above is an outdoor cabinet for telecommunications equipment or the like, it will be appreciated that similar principles also are readily applied to other kinds of enclosures, including indoor cabinets and housings, miniature housings for board-mountable circuit elements, and sealed enclosures for use in submarine and other hostile environments.

Yet another kind of enclosure to which the present invention is usefully applied is an office or residential building, a greenhouse, or the like. In such an enclosure, among others, the switchable thermal behavior of the air layer can be used not only to enhance cooling, but also to enhance heating. That is, when the indoor temperature is both lower than a desired level and lower than the outdoor temperature, the air layer is advantageously set in motion in order to enhance heat transfer from the outdoor to the indoor environment.

Sealed enclosures, in particular, may be filled with a fluid other than air. Exemplary such fluids include gases such as nitrogen, and liquids such as liquid halocarbon compositions. Accordingly, air is only one example of a controllably circulable liquid or gaseous fluid useful in the context of the present invention.

It will also be appreciated that air conditioning is just one example of various methods of active cooling that will be useful in embodiments of the present invention. Other potentially useful methods of active cooling include, for example, electromechanical refrigeration and thermoelectric cooling.

In the illustrative embodiments described above, the air space is formed between a wall or other interior surface and an adjacent panel. Alternatively, the air space can be defined between two panels of an integral unit which can be installed in a suitable through-hole in a wall of an enclosure, such as a window opening, door opening, or the like. Such unit will thus have an "outer" panel meant to face the exterior, and an "inner" panel meant to face the interior of the enclosure. Fans and control circuitry are readily incorporated in such an integral unit, if desired. Although, as noted, the composition of the inner panel is not critical, heat exchange (when desired) will be promoted if the outer panel is composed of a material having relatively high thermal conductivity.

What is claimed is:
1. Apparatus comprising:
an enclosure having an interior defined by bounding surfaces;
at least one panel mounted substantially parallel to a bounding surface of the enclosure and separated by a fluid-filled gap from said surface;
one or more motive devices for controllably moving the fluid through said gap; and
a controller adapted to activate said one or more motive devices under specified interior and external tempera- ture conditions, thereby to enhance heating or cooling of the enclosure by thermal exchange through said surface.

2. The apparatus of claim 1, wherein at least one panel is mounted substantially parallel to a wall, door, or ceiling of the enclosure, and air is the fluid which fills the gap and is controllably moved therethrough.

3. The apparatus of claim 1, wherein the controller is further responsive to humidity.

4. The apparatus of claim 1, comprising two or more said panels, and wherein the controller is adapted to select one or more specific panels for activation of their associated motive devices.

5. The apparatus of claim 4, wherein the selection of specific panels is responsive to measurements of solar loading on different surfaces of the enclosure.

6. A method for controlling the interior temperature of an enclosure having an interior defined by bounding surfaces, comprising:

sensing the interior temperature and an external temperature; and if a condition related to the sensed temperatures is satisfied, setting in motion a layer of fluid lying between at least one bounding surface of the enclosure and a panel mounted adjacent said surface, thereby to switch the fluid-filled layer from a substantially insulative state to a substantially non-insulative state.

7. The method of claim 6, wherein at least one of said bounding surfaces comprises a wall, door, or ceiling of the enclosure, and if the condition is satisfied, there is set in motion a layer of air lying between the panel and at least one said wall, door, or ceiling, thereby to switch the air layer from a substantially insulative state to a substantially non-insulative state.

8. The method of claim 6, further comprising sensing interior humidity, and wherein the condition is further related to humidity.

9. The method of claim 6, further comprising selecting said panel from a plurality of panels for setting in motion the fluid-filled layer associated therewith.

10. The method of claim 9, wherein the selection of the specific panel is responsive to measurements of solar loading on different surfaces of the enclosure.

11. A thermal-exchange unit for installation in a through-hole in a wall of an enclosure, comprising an outer panel and an inner panel which are fixed in a mutually parallel relationship and separated by an air gap; one or more fans for controllably forcing air through the air gap; and a controller adapted to activate the fan or fans under specified interior and external temperature conditions, thereby to enhance heating or cooling of the enclosure by thermal exchange through the outer panel.

* * * * *